United States Patent [19]

Doty et al.

[11] 3,962,497

[45] June 8, 1976

[54] METHOD FOR TREATING POLYMERIC SUBSTRATES PRIOR TO PLATING

[75] Inventors: Warren Russell Doty, Royal Oak; Timothy James Kinney, Berkley, both of Mich.

[73] Assignee: Oxy Metal Industries Corporation, Warren, Mich.

[22] Filed: Mar. 11, 1975

[21] Appl. No.: 557,423

[52] U.S. Cl. .................................. 427/306; 106/1; 134/27; 134/28; 156/2; 427/307
[51] Int. Cl.² ........................ B05D 3/04; B05D 3/10
[58] Field of Search ............ 252/79.4; 427/304, 305, 427/306, 307, 299; 134/27, 28; 106/1; 156/2, 3

[56] References Cited
UNITED STATES PATENTS

| | | | |
|---|---|---|---|
| 3,484,270 | 12/1969 | Suabestre et al. | 252/79.4 |
| 3,620,804 | 11/1971 | Bauer et al. | 427/304 |
| 3,769,061 | 10/1973 | Duthewych et al. | 252/79.4 |
| 3,874,897 | 4/1975 | Fadgen et al. | 252/79.4 |
| 3,889,017 | 6/1975 | Franz et al. | 427/306 |

*Primary Examiner*—Douglas J. Drummond
*Assistant Examiner*—Jerome W. Massie
*Attorney, Agent, or Firm*—B. F. Claeboe

[57] ABSTRACT

The present invention is directed to a process and composition effective prior to the electroless plating of polymeric substrates to substantially completely remove hexavalent chromium ions present in the aqueous acidic solution utilized to etch the plastic part. This novel result is accomplished by treating the polymeric substrate with a hydroxylamine salt in an acidic solution which may contain hydrochloric acid, sulfuric acid or partially neutralized acidic salts. The process and composition of this invention may be employed as a neutralizer prior to the activating step or subsequent thereto as an accelerator, or at both locations in the process for maximum effectiveness.

3 Claims, No Drawings

METHOD FOR TREATING POLYMERIC SUBSTRATES PRIOR TO PLATING

BACKGROUND OF THE INVENTION

It is known in the art to which this invention pertains that plastic parts prior to electroless plating and subsequent electroplating are pre-treated by a sequence of steps basically including etching the surface of the plastic with an aqueous acid solution containing hexavalent chromium ions, one or more water rinses, neutralizing with a dilute inorganic acid such as hydrochloric acid, further water rinses, contacting the surface of the substrate with an acid tin-palladium complex, and additional water rinse, accelerating the activated surface of the plastic, and then one or more water rinses prior to the electroless nickel plating.

After etching acrylonitrile-butadiene-styrene [ABS], polyaryl ethers, polyphenylene oxide, nylon or any other usually chemically plateable plastics employing a mixture of hexavalent chromium and sulfuric acid, it is highly desirable that there be removed essentially all traces of hexavalent chromium ions from the micropores of the plastic surface, as well as from difficult to reach areas such as blind holes, recesses and regions behind the rack contacts. In the prior art, a two or three stage rinsing cycle is frequently used to remove as much hexavalent chromium as is possible. As is also known, any hexavalent chromium carried into the activator step can react with the stannous chloride present in the activator by an oxidation reduction reaction. The valuable stannous chloride which stabilizes the activator solution is thereby lost by this redox reaction. It also occurs that some hexavalent chromium may survive immersion in the activator step and yet leak out during subsequent rinsing or processing steps. In this event, palladium adsorbed on the polymeric parts is removed in the event that drops of hexavalent chromium solution fall onto the other parts or bleed through the blind holes if present. The palladium deficient areas will appear as misplates or skips after subsequent electroplating. If contact areas are effected, complete burn-off may occur.

In order to eliminate the possibility of contamination of the subsequent steps in the process by hexavalent chromium ions, a neutralizer or chromium reducing step is conventionally utilized after water rinsing of the etched polymeric parts prior to the activation of the surfaces thereof. A reducing agent known to the art is $NaHSO_3$ or $SO_2$ at a pH of about 3.0 which generally rapidly reduces the hexavalent chromium upon contact with $NaHSO_3$. One difficulty, however, with $SO_2$ reducing agents is that they must be thoroughly rinsed to prevent carry-over into the activator, where they may reduce and decompose the palladium-tin complexes. Hydrazine compounds are also effective reducing agents for hexavalent chromium ions, but their concentration must be carefully controlled or the plastisol coatings on the racks will become sensitized and plating in electroless nickel will begin. Stannous chloride is another effective reducing agent for use in neutralizers, and stannous chloride can be dragged into the activator without harm. Never-the-less, this compound is sensitive to air oxidation, and air agitation is a very useful method of agitating neutralizers to improve contact and aid in the removal and reduction of hexavalent chromium ions from blind holes and rack contacts.

Relatively small amounts of hexavalent chromium contamination of the order of 10 ppm in an acidic accelerator results in rather severe skipping on plastic parts processed through the system. There are a number of reducing agents which possess the capability of reducing chromium to the relatively harmless trivalent state. For example, $SnCl_2$; $NaH_2PO_2.H_2O$; hydrazine; and $NaHSO_3$. The rate of reaction of $NaH_2PO_2.H_2O$ is very slow, however, and hydrazine or $NaHSO_3$ are such powerful reducing agents that they reduce not only the hexavalent chromium ions, but also other metal ions, such as $Ni^{+2}$ and/or $Pd^{+2}$ which have a beneficial effect in the acidic accelerator solutions. Accordingly, the problem faced is to select a reducing agent which is speedy and powerful enough to render the chromium contamination harmless, while not interfering with the action of beneficial metal ions which have been purposely introduced into the system.

The problems of hexavalent chromium contamination in the acidic accelerator, as well as in the other solutions in the process cycle, are significantly increased if there is not effected a speedy reduction of the chromium in the neutralizer step. Here again, the selection of reducing agents is restricted by considerations of compatibility with the other solutions in the cycle, and also by the need to avoid plating on the rack coatings.

SUMMARY OF THE INVENTION

The instant inventive concept is particularly directed to a method and composition effective to essentially reduce all hexavalent chromium ions which are present on the surfaces of plastic parts after etching in an acidic hexavalent chromium etch and prior to the electroless plating of polymeric substrates. Accomplishment of this novel result is achieved by treating the polymeric substrate with a hydroxylamine salt present in an acidic solution which may contain therein hydrochloric acid, sulfuric acid or partially neutralized acidic salts. It will be manifest as this description proceeds that the process and composition of this invention have effective neutralizing properties prior to the activating step and also subsequent thereto as an accelerator, and can be with very efficient results utilized at both of the mentioned locations with considerable effectiveness.

A neutralizer and/or accelerator solution as provided by this invention basically comprises hydroxylamine salts, exemplified by hydroxylammonium hydroochloride $NH_2OH.HCl$, hydroxylammonium acid sulfate $NH_2OH.H_2SO_4$, hydroxylammonium sulfate $(NH_2OH)_2.H_2SO_4$, and other hydroxylamine salts coming within the purview of this invention which will be manifest to those skilled in the art. Among other advantages, drag-in of these compounds to other solutions in the cycles causes little if any adverse effects, and rack coatings are not significantly sensitized. While effective in the reduction of the chromium ion in the acidic accelerator, these compounds do not reduce the metal ions selected from Group VIII of the Periodic Table which have been incorporated in the solution for the purpose of rack contact activation. Air agitation can be effectively utilized to agitate acidic solutions of hydroxylamine salts.

DESCRIPTION OF THE PREFERRED EMBODIMENT

In a typical chemical plating procedure for polymeric plastic substrates, the plastic part may be first cleaned of surface grime and the like in an aqueous alkali soak solution, the cleaned part may then be contacted with an organic solvent medium which can be either a single-phase system or an admixed water-organic solvent emulsion, and thereafter followed with a thorough water rinse of the part. The part is then contacted with an aqueous acid solution containing hexavalent chromium ions to etch the surface of the plastic, followed by one or more rinses in water and/or solutions containing chromium-reducing or chromium-extracting agents. The latter step is referred to herein as neutralization and specific formulations therefor will be disclosed hereinafter. The surface of the substrate is then contacted with an acid tin-palladium complex which generally is an activator containing palladium chloride, stannous chloride and dilute hdyrochloric acid, and the polymeric substrate is then carefully rinsed. Thereafter, and also in accordance with the present invention, the activated surface of the plastic is accelerated using a formulation generally similar to that in the neutralizing step, and comprising a hydroxylamine salt in an acidic solution which may contain hydrochloric acid, sulfuric acid or partially neutralized acidic salts. The electroless plating procedure is then normally completed by a water rinse, and immersing or otherwise contacting the substrate surface with a chemical plating solution containing both a reducing agent and a reducible salt of the metal to be deposited on the surface, such as nickel, cobalt, copper or the like. The metallized surface is then rinsed with water and is now ready for conventional electroplating.

Accelerating a substrate surface after activation is of course a generally well-known procedure. While in the neutralization step hexavalent chromium ions are contacted and reduced by the neutralizer of this invention. However, upon occasion some hexavalent chromium ions may avoid contact with the reducing agent in the neutralizer as well as the stannous chloride ions in the activator because they are in difficult to reach areas such as blind holes or behind rack contacts and may still be present as the part goes into the accelerator step. Use of the accelerator step is theorized on the assumption that during activation of the substrate not only is palladium or another catalytic material laid down to provide the necessary initiating foci for the reduction of metal ions in the electroless plating solution, but excess stannous ions and/or other tin compounds which are also present in know activating solutions are also deposited on or at least adhere to the surface of the substrate. In addition during the water rinsing subsequent to the activating step there occurs hydrolysis of palladous chloride and stannous chloride and possibly a reduction of a portion of the palladous chloride by stannous chloride for that portion of the activator solution which is entrained in microscopic cavities in the surface of the polymeric substrate. The stannous ions in the form of stannous hydroxide, as well as the stannic compounds resulting from the oxidation of stannous compounds are generally rapidly soluble in dilute acid solutions. Contact with hexavalent chromium ions at this point is believed to promote too rapid a removal of the partly reduced palladium compounds relative to the tin hydroxide compounds. The problem is one of promoting removal of these tin compounds preferentially to palladium particles or foci, since the latter are necessary as catalyzing sites. The known accelerating solutions are quite effective in removing tin compounds, but their use is critical if they are contaminated with as little as 5 to 10 ppm of hexavalent chromium because they then remove excessive amounts of the palladium and thus impede successful accomplishment of electroless plating.

The novel results achieved by this invention in the reduction of hexavalent chromium to a non critical trivalent state are accomplished by treating the polymeric substrate with a hydroxylamine salt in an amount ranging from about 0.5 to 10 g/l in an acidic solution containing hydrochloric acid, sulfuric acid or partially neutralized salts in the amount of approximately 10 to 225 g/l. Specific examples of formulations of the reducing agent of this invention will now be set forth.

EXAMPLE I

An accelerator solution was formulated as follows:

| | |
|---|---|
| $NaHSO_4$ | 100 g/l |
| $NaCl_2$ | 19 g/l |
| $(NH_2OH)_2.H_2SO_4$ | 1 g/l |
| $NiSO_4.6H_2O$ | 1 g/l |

It was observed that with the above formulation operated at 120° to 140°F with immersion times of 30 seconds to 4 minutes activated ABS parts were properly accelerated. No hexavalent chromium was detected and all the chromium ions were in the trivalent state. No rack plating occured. The accelerator could be operated with either air or mechanical agitation.

EXAMPLE II

An accelerator formulation was prepared which contained:

| | |
|---|---|
| $HBF_4$ | 35 g/l |
| HCl | 15 g/l |
| $(NH_2OH)_2.H_2SO_4$ | 1 g/l |
| $NiCl_2$ | 1 g/l |

Analyses indicated complete absence of hexavalent chromium, there was basically no skipping and the parts were in excellent condition. No rack plating occured. This solution was used at 115° to 135°F for 1 to 3 minutes with air or mechanical agitation.

EXAMPLE III

An additional accelerator solution was prepared containing the following:

| | |
|---|---|
| HCl | 22 g/l |
| HF | 1 g/l |
| $NiCl_2.6H_2O$ | 1 g/l |
| $NH_2OH.HCl$ | 1 g/l |

Operated at 120° to 130°F for ½ to 1½ minutes with either air or no agitation. The results obtained were comparable to those earlier indicated in connection with the first two examples set forth.

To further illustrate the invention, additional tests were performed which included the addition of 10 ppm hexavalent chromium to a conventional acidic accelerator and there resulted severe skipping on ABS panels. The addition of 27 ppm of $NH_2OH.HCl$ returned the solution to normal operation.

The addition of 1 g/l $(NH_2OH)_2.H_2SO_4$ to an acidic accelerator containing 15 g/l HCl and 1 g/l $NiCl_2.6H_2O$ was operated in a commerical plant and continued to operate successfully for at least five weeks. At the end of this interval the accelerator was analyzed and found to contain 210 ppm of chromium, all as trivalent chromium.

Another commercial accelerator initially containing 1 g/l $(NH_2OH)_2.H_2SO_4$ was found to have a chromium content of 70 ppm after just 4 days of operation. If hexavalent chromium was not reduced, severe skipping would have occured in less than 1 day.

A neutralizer containing about 55 g/l HCl was used in plating on plastics in a commercial operation. Rejects due to hexavalent chromium entrapment in a recess where rack contact was being made on a small part was observed over a period of 2 to 3 days. The rejects ranged from between about 50 to 100 parts per rack of a total of 500 parts. Hexavalent chromium bled out from the blind hole behind the contacts and was believed to be removing palladium activator near the contacts. This prevented electroless nickel from depositing uniformly in this region resulting in poor electrical contact to the rack tips. When 4 g/l $(NH_2OH)_2.H_2SO_4$ was added to the neutralizer solution it was observed that rejects decreased to an average of about 10 pieces per rack of 500 parts.

In order to illustrate further the novel results accomplished when the teachings of the instant invention are followed, additional formulations were prepared and tested and these are set forth below.

EXAMPLE IV

A neutralizer composition having the following compounds was prepared:

| | |
|---|---|
| HCl | 5 g/l |
| $(NH_2OH)_2.H_2SO_4$ | 5 g/l |

Use of this composition with a one minute immersion at room temperature provided results equally as good as those compositions having present therein a hydroxylamine salt in an acidic solution.

EXAMPLE V

Another neutralizer was prepared which included:

| | |
|---|---|
| HCl | 22.9 g/l |
| $(NH_2OH)_2.H_2SO_4$ | 7.9 g/l |

After 1 or 2 minutes immersion time at room temperature there resulted complete coverage, indicating that all chromium present was reduced to the harmless trivalent state.

EXAMPLE VI

A further neutralizer formulation was prepared which contained:

| | |
|---|---|
| HCl | 46.1 g/l |
| $(NH_2OH)_2.H_2SO_4$ | 7.6 g/l |

The results were as good as in Example V above.

EXAMPLE VII

A neutralizer solution was prepared containing the following:

| | |
|---|---|
| HCl | 70.0 g/l |

-continued

| | |
|---|---|
| $(NH_2OH)_2.H_2SO_4$ | 7.8 g/l |

Again equally good results to those obtained with the formulation of Examples V above resulted.

As has been previously stated, the novel compositions and process of this invention may be employed as a neutralizer prior to the activating step or subsequent thereto as an accelerator or at both locations in the process for maximum effectiveness.

Additional accelerator formulations were prepared as set forth below:

EXAMPLE VIII

| | |
|---|---|
| $NaHSO_4$ | 100 g/l |
| NaCl | 15 g/l |
| $(NH_2OH)_2.H_2SO_4$ | 1 g/l |

Excellent results were obtained after an immersion time of 1 ½ minutes at 135°F.

EXAMPLE IX

An additional accelerator formulation was utilized which contained:

| | |
|---|---|
| $NaHSO_4$ | 145 g/l |
| NaCl | 30 g/l |
| $(NH_2OH)_2.H_2SO_4$ | 3.5 g/l |
| $NiCO_3$ | 2.0 g/l |

This was used at an immersion time of 2 minutes at 140°F and provided excellent results over a period of at least 3 weeks under heavy loading conditions, even when containing in excess of 200 ppm chromium, all in the trivalent state.

A number of changes and modifications in the formulations and procedures herein described can of course be made without departing from the spirit of the invention or the scope of the subjoined claims.

What is claimed is:

1. A method of treating a polymeric plastic substrate prior to plating a surface thereof, which comprises etching a surface of the substrate with an aqueous acid solution containing therein hexavalent chromium ions, rinsing and neutralizing, activating the etched substrate surface by contact with an acidic tin-palladium complex medium, rinsing the activated surface and accelerating said activated and rinsed surface of the polymeric substrate, the improvement which comprises contacting the polymeric substrate, in either or both the neutralizing and accelerating step with a hydroxylamine salt in an acidic solution containing therein hydrochloric acid, sulfuric acid or partially neutralized acidic salts whereby the hexavalent chromium ions from the etching step are reduced to the trivalent state.

2. A method of treating a polymeric plastic substrate as defined in claim 1, in which the hydroxylamine salt is present in the amount of about 0.005 to 10 g/l and the acidic solution is from approximately 10 to 225 g/l.

3. A method of treating a polymeric plastic substrate as defined in claim 1, in which the hydroxylamine salt is selected from the group consisting of hydroxylamine hydrochloride, $NH_2OH.HCl$, hydroxylammonium acid sulfate, $NH_2OH.H_2SO_4$, hydroxylammonium sulfate, $(NH_2OH)_2.H_2SO_4$ and related compounds.

\* \* \* \* \*